(12) United States Patent
Yu et al.

(10) Patent No.: US 12,004,327 B2
(45) Date of Patent: Jun. 4, 2024

(54) CONTAINERIZED HVAC CONTROL

(71) Applicant: SolarEdge Technologies Korea Limited Company, Seongnam-si (KR)

(72) Inventors: Ho-June Yu, Suwon (KR); Jeong-Hyun Bang, Seoul (KR); Jong-Sik Park, Suwon (KR)

(73) Assignee: SolarEdge Technologies Korea Limited Company, Seongnam-si (KR)

(*) Notice: Subject to any disclaimer, the term of this patent is extended or adjusted under 35 U.S.C. 154(b) by 0 days.

(21) Appl. No.: 17/132,856

(22) Filed: Dec. 23, 2020

(65) Prior Publication Data

US 2021/0204447 A1 Jul. 1, 2021

Related U.S. Application Data

(60) Provisional application No. 62/954,220, filed on Dec. 27, 2019.

(51) Int. Cl.
*H05K 7/20* (2006.01)
(52) U.S. Cl.
CPC ..... *H05K 7/20736* (2013.01); *H05K 7/20145* (2013.01)
(58) Field of Classification Search
CPC ........... H05K 7/20745; H05K 7/20754; H05K 7/20736; H05K 7/20145; H05K 7/20836; H05K 7/20572; H05K 7/20181; F24F 2221/40; G06F 1/20; G06F 2119/08
USPC ............ 361/679.46; 62/259.2; 165/287, 288, 165/80.2, 104.33; 700/300, 276, 299, 278
See application file for complete search history.

(56) References Cited

U.S. PATENT DOCUMENTS

| | | | |
|---|---|---|---|
| 6,574,104 B2 | 6/2003 | Patel et al. | |
| 7,867,070 B2 | 1/2011 | Day | |
| 7,916,487 B2 * | 3/2011 | Bitton | G11B 33/1406 361/679.02 |
| 8,593,815 B2 | 11/2013 | Claassen et al. | |
| 8,885,335 B2 * | 11/2014 | Magarelli | G06F 1/206 361/679.54 |
| 9,847,654 B2 | 12/2017 | Beaston | |

(Continued)

FOREIGN PATENT DOCUMENTS

EP 2079000 A2 7/2009

OTHER PUBLICATIONS

May 25, 2021—Partial European Search Report—EP 20217005.6.
(Continued)

*Primary Examiner* — Mandeep S Buttar
(74) *Attorney, Agent, or Firm* — Banner & Witcoff, Ltd.

(57) ABSTRACT

Disclosed is a containerized heating, ventilation, and air-conditioning (HVAC) system comprising an HVAC unit and one or more ducts from the HVAC unit to an equipment rack. The ducts prevent mixing between the fresh and exhaust airflow, thus improving efficiency. Sensors located at sources of heat generating equipment within the racks may be used by controllers to monitor temperatures of the components at the source of heat generation, typically at the highest temperatures. The temperatures may be aggregated to determine the temperatures of devices, modules, racks, and the container interior cavity. Dampers on the ducts, at the rack inlets, at the module inlets, at the devices inlets, and such may assist in regulating airflow preferentially to the hottest components, devices, modules, or racks.

18 Claims, 6 Drawing Sheets

(56) References Cited

U.S. PATENT DOCUMENTS

| | | | |
|---|---|---|---|
| 10,039,212 B2* | 7/2018 | Slessman | F28F 9/0265 |
| 10,136,561 B2 | 11/2018 | Clidaras et al. | |
| 10,285,304 B1* | 5/2019 | Lin | G01F 1/76 |
| 10,368,466 B1* | 7/2019 | Frink | H05K 7/20736 |
| 11,096,316 B1* | 8/2021 | Lachapelle | H05K 7/20145 |
| 2002/0108386 A1* | 8/2002 | Spinazzola | H05K 7/20745 |
| | | | 62/419 |
| 2008/0062647 A1* | 3/2008 | Hillis | G06F 1/20 |
| | | | 361/699 |
| 2008/0280192 A1 | 11/2008 | Drozdz et al. | |
| 2010/0170277 A1* | 7/2010 | Schmitt | H05K 7/20745 |
| | | | 165/104.34 |
| 2011/0245981 A1* | 10/2011 | Refai-Ahmed | G06F 1/3203 |
| | | | 700/282 |
| 2012/0101648 A1* | 4/2012 | Federspiel | F24F 11/77 |
| | | | 700/291 |
| 2012/0190292 A1 | 7/2012 | Skrepcinski et al. | |
| 2012/0271935 A1* | 10/2012 | Moon | G06F 9/5094 |
| | | | 709/224 |
| 2014/0206272 A1 | 7/2014 | Kodama | |
| 2014/0238639 A1* | 8/2014 | Ambriz | H05K 7/20745 |
| | | | 165/57 |
| 2015/0250076 A1* | 9/2015 | Kondo | H05K 7/20836 |
| | | | 361/679.48 |
| 2015/0264837 A1* | 9/2015 | Clidaras | H05K 7/20754 |
| | | | 165/287 |
| 2017/0201077 A1 | 7/2017 | Hafner et al. | |
| 2017/0288184 A1* | 10/2017 | Schnakofsky | H01M 50/267 |
| 2018/0352683 A1* | 12/2018 | Karrat | G06F 1/206 |
| 2019/0343024 A1* | 11/2019 | Graham | H05K 7/20745 |
| 2021/0100135 A1* | 4/2021 | Gao | E04H 5/02 |

OTHER PUBLICATIONS

GForce IR in Row Cooling Unit—Chilled Water, Air and Water/Glycol Cooled Units—Installation, Operation & Maintenance Manual, Data Aire, Inc.

A. Bhatia, "HVAC Cooling Systems for Data Centers," Continuing Education and Development, Inc.

"Flexible, high efficiency cooling solutions," Data Centre, Airedale International Air Conditioning Limited.

Atsushi Honzawa et al., "Container-type Energy Storage System with Grid Stabilization Capability," Hitachi Review, vol. 63, No. 7, pp. 432-437, 2014.

A. H. Khalaj & S. K. Halgamuge, "A Review on efficient thermal management of air- and liquid-cooled data centers: From chip to the cooling system," Applied Energy, 205, pp. 1165-1188, Nov. 2017.

B. Shabani & M. Biju, "Theoretical Modelling Methods for Thermal Management of Batteries," Energies, 8, pp. 10153-10177, Sep. 2017.

1U rack mount cluster chassis servers MyriNet clustering connectivity, The CCSI Clusteron, retrieved from www.clusteron.com/cooling.htm.

"New HCS Integrates with Third-Party Manufacturers' Enclosures," Wright Line an Eaton Brand, retrieved from www.wrightline.com/news_and_events/newsitem.html?id=134306.

Airedale International Air Conditioning Limited Product Guide.

Patch Panel, Equipment Rack, Server Rack, and Computer Rack Products, L-com Global Connectivity, retrieved from www.l-com.com/patch-panel-server-rack.

* cited by examiner

CONTAINERIZED HVAC CONTROL

CROSS-REFERENCE TO RELATED APPLICATIONS

This application claims priority to U.S. Provisional Patent Application No. 62/954,220, filed Dec. 27, 2019. The entire disclosure of the foregoing application is incorporated by reference in its entirety.

BACKGROUND

The invention relates to the field of heating, ventilation, and air-conditioning control (HVAC).

Shipping containers may be used as electrical and electronic infrastructure operational components, such as containers configured to operate as energy storage systems, datacenters, power components for datacenters, network communication centers, cellular network electronics, etc. The containerized electronics enjoy many benefits such as rapid deployment, easy transport, commoditized infrastructure, easy planning, easy maintenance, etc. The containers typically are sold as devices contain racks of electronics equipment dedicated for the application, and support equipment.

Containerized rack equipment may include a standardized container, 19-inch equipment racks, and control electronics in the interior of the container. In many circumstances, also included is an HVAC system for maintaining the temperature inside the container (typically mounted on the top or side of the container), especially when the rack equipment operates within a defined temperature range. The equipment racks may be arranged in rows within the container, where each rack may include multiple modular electronic components (modules), and cable (such as with cable guides) for interconnecting the modules. The modules may produce heat during operation, and operate in a defined temperature range. The HVAC system includes a temperature sensor configured to maintain the ambient temperature within the container interior at the desired temperature. The rack equipment uses the interior air pool to cool the components as needed, using a temperature sensor configured to operate a fan, such as using a controller.

HVAC for rack systems may use hot-row/cold-row control topology for cooling electrical equipment with each rack in a row of racks. This topology may be used in containerized rack systems. Alternative topology uses in-row cooling, by piping the coolant from the external HVAC unit to locations within each row of racks, cooling (or heating when needed) can be achieved and the hot-row/cold-row topology is maintained. For example, the coolant absorbs heat generated by the air flowing to one or more modules, and pumps the heat outside of the container using the HVAC system.

The modules located within the racks may include electronics modules, power modules, battery modules, server modules, blade server modules, and/or the like. For example, a containerized server farm comprises primarily server or blade server modules, telecommunication equipment modules, cooling modules, power modules, uninterruptable power supply (UPS) modules, and/or the like. For example, a containerized battery energy storage system (BESS) may contain battery modules, power control modules, power conversion modules, cooling modules, telecommunication modules, and/or the like.

The background is not intended to limit the disclosed aspects of features, and not intended as limiting the application to a particular field or problem.

SUMMARY

The following summary is a short summary of some of the inventive concepts for illustrative purposes only and is not intended to limit or constrain the inventions and examples in the detailed description. One skilled in the art will recognize other novel combinations and features from the detailed description.

Containers of electronic devices (typically organized in 19" racks) may include a heating, ventilation, and air-conditioning (HVAC) unit connected to a duct system to limit mixing of the HVAC output and the device exhaust air. The duct system may extend substantially from the HVAC output to the devices, from the devices exhaust to the HVAC, or in both directions. The system may include temperature sensors located on the racks, modules, devices, or internal components to determine the operation of the HVAC. Temperature sensors outside the container may also be included. Cross sections of the ducts may be configured to provide uniform airflow to each rack, module, device and component in the container, such as decreasing cross sections at locations father down the ducts from the HVAC. Dampers (e.g., valves regulating the airflow inside ducts) may be used on the duct system, to further regulate the availability of HVAC output to the devices of different racks. For example, each rack may have a damper, each module may have a damper, each device may have a damper, each component may have a damper, or any combination thereof. The sensor data may be monitored by one or more controllers, such as the HVAC controller, the rack controller, the container master electronics controller, the module controller, the device controller, etc. Temperatures of the components, devices, modules, racks, etc. may he calculated, including temperature trends, previous states of the HVAC (heating, cooling, etc.), outside ambient temperature, and the like. These data may be used to determine HVAC state of operation, the position of dampers, etc. In this manner, the cooling of the components can be adapted based on the individual temperatures of the components, and separating intake air from exhaust air allows a higher operational efficiency of the HVAC system.

Other aspects of this disclosure include the control loops dedicated to maintaining a temperature range in the containerized equipment racks. For example, specialized control loops may operate at the HVAC system level, to determine the operational state, temperature thermostat setting, and flow rate of the HVAC. Control loops may operate at the rack level to control dampers to the rack and each module in the rack, or at the module level. The control loops may determine the damper positions for the components of the module, the position of the module damper, the position of the rack damper, the HVAC system settings (such as temperature thermostat setting, flow setting, state setting, etc.). For example, each component in the container may produce heat depending on the operation of that component, where some components are active and produce heat and other components not active (no heat).

Further aspects may be determined by the application of the containerized devices and the nature of the components. For example, containerized data centers may benefit from incorporating a duct system to cool rack servers, and the control loop may direct the rack servers to lower the clock frequency of the rack CPUs when the HVAC cooling limit has been reached. For example, a containerized battery energy storage system (BESS) may benefit from incorporating a duct system to cool batteries during charge or discharge. When the example HVAC cooling limit has been reached, the control loop may lower the charge or discharge current to some of or all of the batteries, suspend operation of a portion of the batteries in the container, etc. For example, a containerized power module, such as for supplying power to a containerized server farm, may benefit from the duct system with sensors on the components of the power converters. When the HVAC cooling reaches a limit, the controllers of the HVAC may signal one or more power converters to shut down or reduce current flowing through the converter (e.g. derating). For example, a containerized network center may benefit from a HVAC duct system, and when the HVAC cooling limit is reached, a controller may signal one or more network devices to lower their transmission rate, network speed, or the like.

As noted above, this Summary is merely a summary of some of the features described herein. It is not exhaustive, and it is not to be a limitation on the claims.

BRIEF DESCRIPTION OF THE DRAWINGS

These and other features, aspects, and advantages of the present disclosure will become better understood with regard to the following description, claims, and drawings. The present disclosure is illustrated by way of example, and not limited by, the accompanying figures.

DETAILED DESCRIPTION

Figure 1:
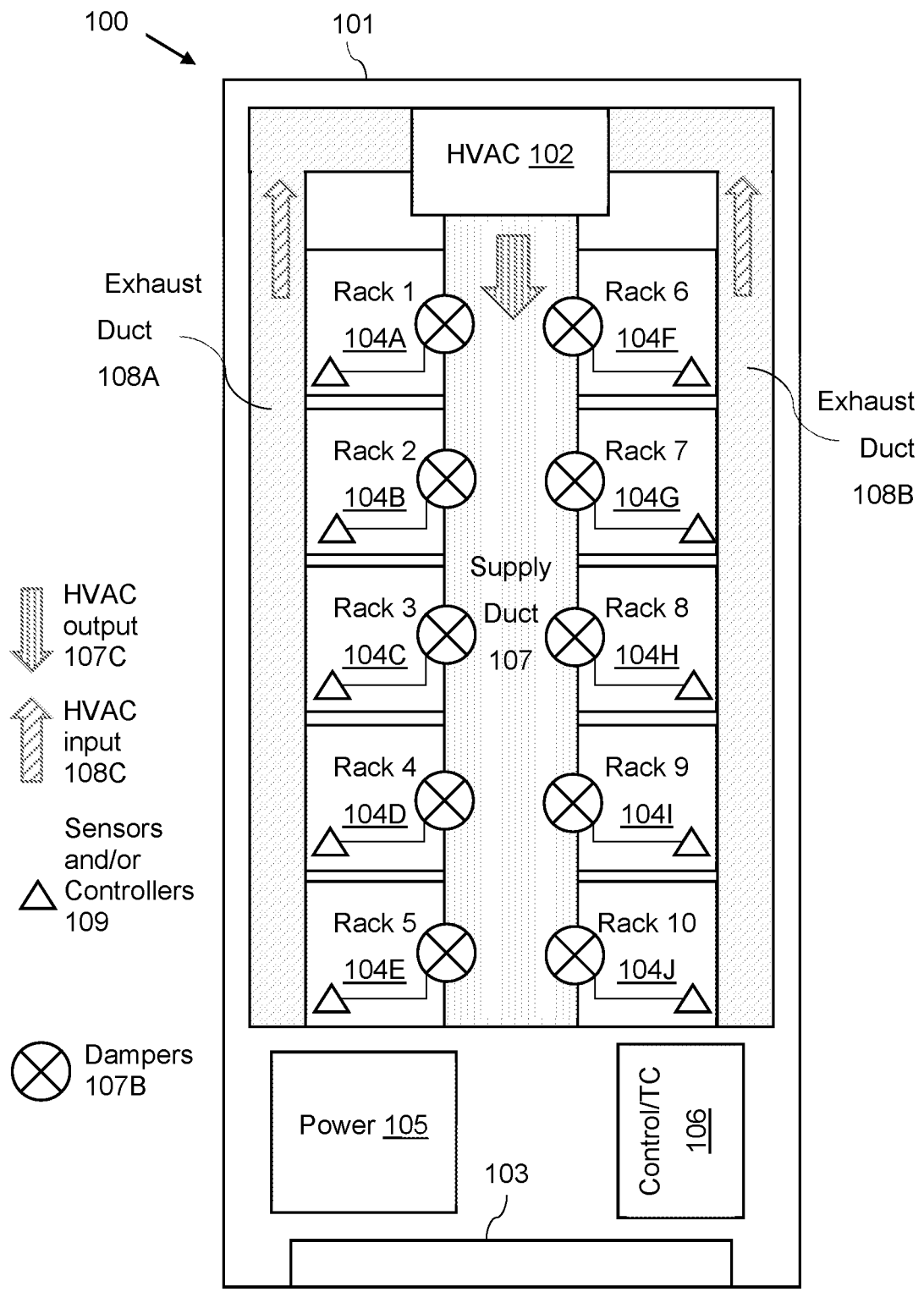
FIG. 1 shows, schematically, a container of rack devices with a two-way duct system, dampers, and sensors.

Disclosed herein are aspects of devices, methods, and systems used for cooling of equipment racks located within a shipping container. One or more ducts are locating within the container between a heating, ventilation, and air-conditioning (HVAC) unit and one or more equipment racks. The ducts may prevent mixing of the rack supply air and exhaust air, thereby making the control of the equipment temperature more efficient. For example, the ducts may extend from the HVAC to the racks and the interior space of the container used as a pool of exhaust air from the racks and inlet to the HVAC. In this example configuration, the HVAC output may be supplied directly to the rack equipment inlets and the interior may be warmer than the HVAC output. In this example, when the HVAC is in a cooling state, the interior may be warmer and more comfortable for operators. For example, the ducts may extend from the racks exhaust to the HVAC inlet, thereby avoiding mixing the equipment exhaust with HVAC supply. In this case, the internal pool of air in container may be maintained at the setpoint temperature (such as the desired equipment temperature) and other equipment (such as power equipment, auxiliary equipment, monitoring equipment, telecommunications equipment, etc.) in the container not connected to the ducts may use this air pool for cooling. The existing structure of the racks may be modified to incorporate ducts, such as ducts incorporated into the panels of the rack (back, side, top, or bottom), the doors of the rack (front), or the like.

As used herein, the example of using an HVAC unit for cooling of heat producing components is used as a default example, but it is understood that the HVAC can operate as a cooling, heating, or ventilation unit in a similar manner to the cooling example. For example, when the ambient temperature outside the container is below zero and the components produce a large amount of heat, the ventilation state of the HVAC unit may be used instead of the air-conditioning state, and the examples describing cooling may be seen as referring to ventilation. Similarly, in some circumstances operating components in sub-zero temperatures may decrease lifetime of components, such as battery cells, and heating may be used instead of cooling to increase the temperature to the setpoint temperature. It is understood that the operation of the HVAC unit in the cooling, heating, and ventilation states are similar in operation, and the examples of cooling used herein may apply mutatis mutandis to heating or ventilation in certain circumstances.

The setpoint temperature refers to the desired temperature of the racks, modules, equipment, devices, or components. The operation of the HVAC thermostat control loop may include a temperature difference threshold, such as a hysteresis value, between the setpoint temperature and the actual temperature of each rack, module, device, or component. The hysteresis value enables providing a hysteresis effect to the control loop, so that there are separate values for turning on the HVAC fan and turning off the HVAC fan. For example, when the absolute difference between the actual temperature and the setpoint temperature is more than 4 degrees Celsius (e.g. the hysteresis value), the HVAC unit may operate in one of the cooling state or the heating state. In this example, when the actual temperature is higher than setpoint temperature by more than 4 degrees Celsius (° C.), the HVAC unit may be set to a cooling mode. When the actual temperature is lower than setpoint temperature by more than 4° C., the HVAC unit may be set to a heating mode. If the absolute difference between the actual temperature and the setpoint temperature is less than 4° C., the HVAC unit may be set to a ventilation mode. The hysteresis value may be between 1 and 20° C. In some circumstances, such as when the operation may require a narrow temperature thermostat setting, the hysteresis value may also be between 1 and 3° C., 1 and 5° C., or 1 and 10° C. The hysteresis value used in different comparing steps may be same as or different from each other steps. When the hysteresis value is larger, there will be less frequent switching on and off of the HVAC system, but the temperature swings between on and off states will be larger.

In some example applications, it may be beneficial to extend the ducts for HVAC to the racks and back, thereby creating a bidirectional loop with minimum air volume. Minimum air volume may be more efficient due to lowering losses from heat leaking through the container walls, for example the internal pool of air may act as an insulator between the ducts and the ambient temperature outside the container. Using bidirectional closed loops (HVAC to components and back to HVAC) may allow cooling in some of the equipment racks and heating in others, such as by using two HVAC units or a two independent output HVAC unit (e.g., an HAVC unit having two independent outputs). For example, in the case where two HVAC units are used, a first HVAC unit may be configured for a first setpoint temperature used by some of the equipment racks and a second HVAC unit may be configured for a second setpoint temperature used by some others of the equipment racks.

The ducts may extend from the HVAC to the rack, within the rack to the modules, within the modules to the devices, and within the devices to the components. In some examples applications, the ducts may extend directly from the rack to the devices or components, or from the modules to the components. For example, in a containerized datacenter application when the computer processors generate the most heat (such as to maintained the processors at a lower temperature and extend the processor lifetime), the ducts may extend from the HVAC directly to the processors components within each device of each module. For example, when the equipment racks contain modules of battery cells, the ducts may extend to the racks, the racks may have internal extensions of the ducts to the modules, and the modules may uniformly distribute the supply air to the battery cells in each module. For example, the cross section of the ducts may decrease the further from the HVAC the duct providing each group of racks, modules, devices, and components with uniform airflow.

Sensors may be placed on the equipment racks, on the modules in the rack, on the devices in the modules, or on the components within the devices. For example, the sensors may include temperature sensors to monitor the temperature at components that produce heat, voltage sensors to monitor a thermocouple voltage, current sensors to monitor current flow direction (such as charge or discharge) and current flow magnitude. For example, the measurement of electrical current may be used to calculate cooling needs based on known efficiencies (and therefor calculate the heat generation and temperature increase) of the power devices and components. In this example, the current is easy to measure and may predict a future rate of cooling desired thereby allowing setting the HVAC unit to the desired settings before the temperature increases from the generated heat. The sensor values may be monitored to determine the rack, module, device, or component temperatures, and the temperature values used to control the HVAC operation (state, temperature set point, fan speed, etc.). For example, the temperature sensors may be located on the battery cells in a containerized battery energy storage system (BESS). In another example, the temperature sensors may be located on the module's metal frame to monitor an average temperature for the module.

Dampers may be included in the duct systems, such as on the duct entrance on each rack, the duct entrance on each module in a rack, a duct entrance on each component, or combinations thereof. For example, dampers on the entrance to each rack may allow adjusting the flow of HVAC output to each rack based on the average rack temperatures. For example, temperature sensors on each component of the rack module (such as battery cells, processors, graphics processing units, transmission amplifiers, and/or the like), and the sensor values analyzed (by a hardware processor) to compute a rack temperature that determines the damper position for each rack. Controlling the damper positions may allow the components producing the most heat to receive the greatest airflow from the HVAC, and thereby making the cooling of the components more efficient.

In containerized HVAC systems, using ducts, sensors, and/or dampers may allow regulating the HVAC output to each heat producing component of within the container in an efficient and energy saving manner. Typically in placing equipment racks in a container, the container interior air volume acts as a pool of air for cooling or heating the equipment. The equipment racks draw air from the pool for heating or cooling the rack equipment, such as modules, devices within the modules, or components within the devices. The exhaust air from the rack equipment is mixed in the pool, and the HVAC maintains the pool at the desired operational temperature. This is an indirect cooling system, and suffers that the hot exhaust air from the rack mixes with the cool air from the HVAC thereby reducing the cooling efficiency.

Some containerized rack systems use a hot-aisle/cold-aisle containment similar to the topology used in permanent, building-based datacenters. These topologies require sufficient room within the container thereby reducing the number of racks within the container. For example, using a hot-aisle/cold-aisle containment in a container of racks allows one row of racks along the length of the container, while using a duct system containment allows two rows of racks within the container. In-row cooling solutions also prevalent in datacenters may be used in containerized rack equipment, but the in-row cooling equipment will also require space that may be utilized for components.

Reference is now made to FIG. 1, which shows, schematically, a container system 100 of rack devices with a two-way duct system, dampers and sensors. Container system 100 includes a shipping container enclosure 101, and HVAC unit 102, and equipment racks 104A-104J. Enclosure 101 includes an entrance 103, one or more power devices 105, and control and telecommunications (TC) devices 106. Entrance 103 may be used for equipment maintenance, installation, or otherwise operating equipment. Power devices 105 may supply power to the devices in the container, control power storage and use, control battery charging and discharging, rectify grid power for charging batteries, or invert battery power to grid power (e.g. at a different voltage, current, type, etc.). TC devices 106 may control communications of telemetries, device status, system operation, cell voltages, charge/discharge states, etc. to a central monitoring and management system external to the container. An air supply duct 107 may extend and supply HVAC output flow 107C from HVAC unit 102 to equipment racks 104A-104J. Air exhaust duct 108A and 108B may extend and transfer HVAC intake flow 108C from equipment racks 104A-104J to HVAC unit 102. Equipment racks 104A-104J may include dampers 107B for controlling the air supply from the supply duct 107, where positions of dampers 107B may be determined by one or more sensors and controllers 109 in equipment racks 104A-104J. Using dampers 107B to limit supply air to equipment racks whose temperature is closer to the setpoint temperature may provide more supply air to the racks whose temperature is farther from the setpoint temperature.

Figure 2A:
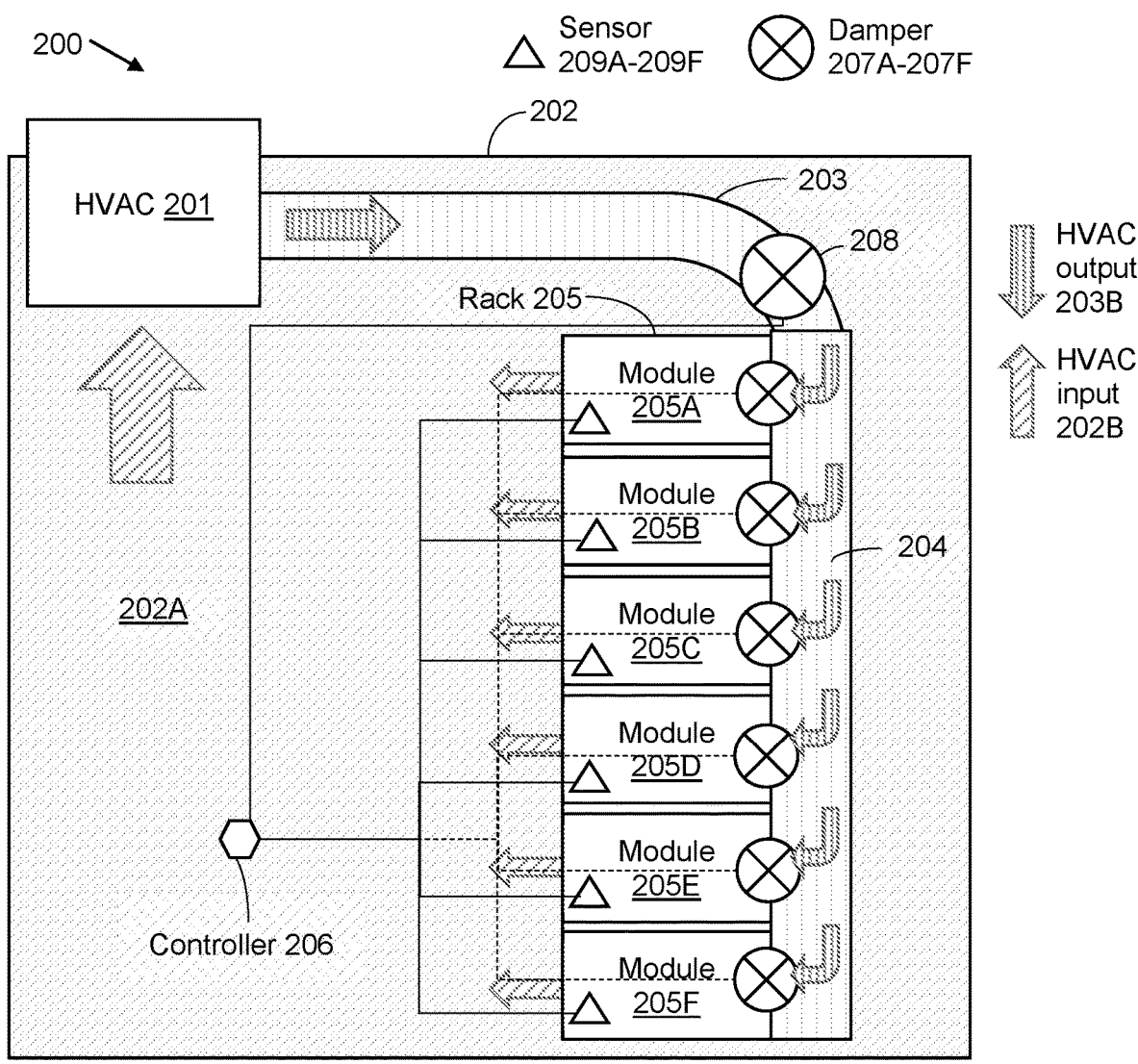
FIG. 2A shows, schematically, a containerized rack of modules/devices with supply-side ducts, dampers, and sensors.

Reference is now made to FIG. 2A, which shows, schematically, a containerized rack 205 of modules/devices 205A-205F with supply-side ducts 203 and 204, dampers 207A-207E and sensors 209A-209F. A containerized system 200 includes an enclosure 202 (such as a shipping container), an HVAC unit 201, one or more equipment racks such as rack 205, and a supply duct 203 from HVAC unit 201 to rack 205 to supply HVAC output flow 203B to equipment 205A-205F. For example, the rack 205 may be any one of equipment racks 104A-10J shown in FIG. 1.

Within rack 205 an internal rack duct 204 supplies HVAC output air 203B to rack modules 205A-205F, and the exhaust air from the equipment is released into an internal cavity 202A of enclosure 202. HVAC unit 201 may draw exhaust air from internal cavity 202A as in HVAC intake flow 202B. A controller 206, such as a rack controller, a HVAC controller, a container controller or the like, monitors the temperatures for each module 205A-205F by collecting values from sensors 209A-209F and computing temperatures for the battery cells, devices, modules, or the entire rack. Controller 206 may determine HVAC unit 201 operation and settings based on measured/computed temperatures. A rack damper 208 and module dampers 207A-207F may be positioned, by controller 206, such as based on the measured/computed temperatures, to regulate airflow to each rack/module. For example, when a temperature is high, the dampers for that rack/module may be incrementally opened to increase airflow, such as incrementally opened by 5 degrees rotation to allow an additional 10% increased airflow. For example, when a temperature is low, the dampers for that rack/module may be incrementally closed to decrease airflow, such as incrementally closed by 7 degrees rotation to allow a 15% decreased airflow.

It may be noted that the relationship between the orientation or position of the damper and the airflow does not need to be linear, and may be further dependent on a fan speed of the HVAC. In some circumstances the relationship may be determined and a lookup table of formula used to convert the change in position/orientation of the damper to desired increase or decrease in airflow. By adjusting the dampers for increased or decreased airflow, the hotter racks/modules/devices/components may receive more cooling airflow than the colder ones. Since the exhaust from the racks is released into internal cavity 202A, internal cavity 202A air temperature may be at a higher and more comfortable temperature for operators than the HVAC unit 201 output. Dampers may be located along ducts, at junctions of ducts at the inlets, or at junctions of ducts on outlets.

In some cases, controller 206 may be configured to control operation of modules in the equipment rack based on a comparison between the measured/computed temperature and the set point. (e.g., the setpoint temperature). For example, in a containerized data center, when the measured/computed temperature exceeds the set point by the hysteresis value, controller 206 may instruct the rack servers to lower the clock frequency of the rack CPUs. As another example, in a containerized BESS, when the measured/computed temperature exceeds the set point by the hysteresis value, controller 206 may decrease the charge or discharge current to at least one of the batteries in the container, suspend operation of a portion of the batteries in the container, etc. Still as another example, in a containerized power module, when the measured/computed temperature exceeds the set point by the hysteresis value, controller 206 may instruct one or more power converters to shut down or reduce current flowing through the converter. Yet as another example, in a containerized network center, when the measured/computed temperature exceeds the set point by the hysteresis value, controller 206 may instruct one or more network devices to lower their transmission rate, network speed, or the like.

Figure 2B:
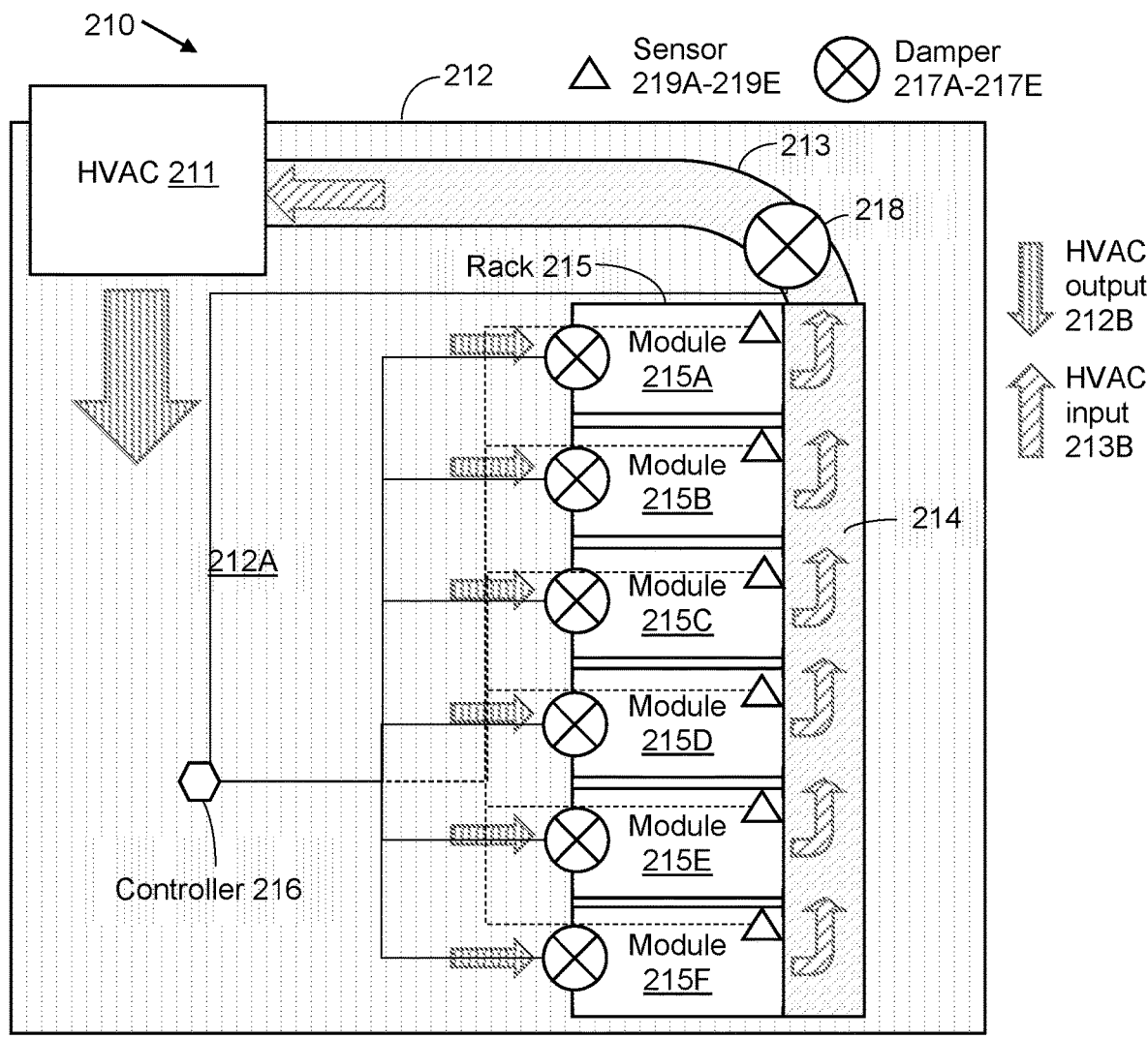
FIG. 2B shows, schematically, a containerized rack of modules/devices with an exhaust-side duct, dampers, and sensors.

Reference is now made to FIG. 2B, which shows, schematically, a containerized rack 215 of modules/devices 215A-215F with an internal rack duct 214, dampers 217A-217F and sensors 219A-219F. A containerized system 210 includes an enclosure 212 (such as a shipping container), an HVAC unit 211 one or more equipment racks such as rack 215, and an exhaust duct 213 from rack 215 to HVAC unit 211. Within rack 215 an internal rack duct 214 releases exhaust air from rack modules 215A-215F, and HVAC intake flow 213B for HVAC unit 211 is drawn from exhaust duct 213. HVAC unit 211 supplies HVAC output flow 212B to internal cavity 212A. A controller 216, such as a rack controller, a HVAC controller, a container controller or the like, monitors the temperatures for each of modules 215A-215F by collecting values from sensors 219A-219F and computing temperatures for the battery cells, devices, modules, or the entire rack. Controller 216 may determine HVAC unit 211 operation and settings based on measured/computed temperatures. Similar to FIG. 2A, in FIG. 2B, a rack damper 218 and module dampers 217A-217F may be positioned, by controller 216, such as based on the measured/computed temperatures, to regulate airflow to each rack/module and deliver more cooling airflow to hotter racks/modules/devices/components than to the colder ones. Since the HVAC unit 211 output is released into internal cavity 212A, internal cavity 212A air temperature may be close to the setpoint temperature, and the cavity air (e.g., air inside internal cavity 212A) may be used to cool other components in the container. When the cavity air is used to cool other components without ducts, their exhaust will be released into internal cavity 212A thereby increasing the cavity air and partially reducing efficiency. To solve this problem, the system in FIG. 2B uses exhaust duct 213 and internal rack duct 214 to release the exhaust air from rack modules 215A-215F and to separate the exhaust air from the cavity air, thereby increasing efficiency. Dampers may be located along ducts, at junctions of ducts at the inlets, or at junctions of ducts on outlets.

Figure 3:
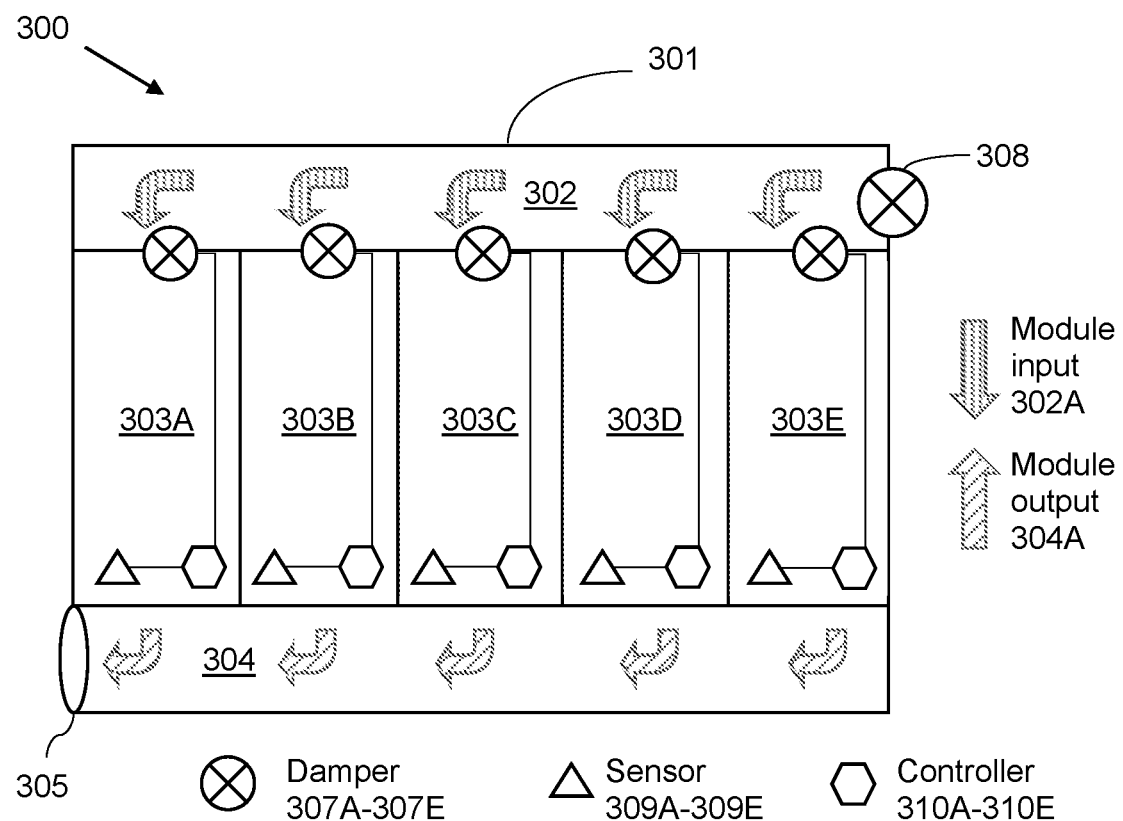
FIG. 3 shows, schematically, a containerized module of devices with module ducts, dampers, and sensors.

Reference is now made to FIG. 3, which shows, schematically, a containerized module 300 of devices 303A-303E with module ducts 302 and 304, dampers 307A-307E, and sensors 309A-309E. For example, the containerized module 300 may be any one of modules 215A-215F shown in FIG. 2B. Module 300 may include an enclosure 301, devices 303A-303E, and ducts 302 and 304. Devices 303A-303E may include computers, power converters, battery cells, electronic equipment, transceivers, or combinations thereof. Devices 303A-303E may include dampers 307A-307E and/or sensors 309A-309E operated by controllers 310A-310E. Controllers 310A-310E may monitor sensors 309A-309E values to compute temperatures of devices 303A-303E, components therein (not shown), or module 300. Controllers 310A-310E may operate dampers 307A-307E and determine positions of these dampers based on computed temperatures. Module 300 may include a module damper 308 (e.g., one of dampers 217A-217E in FIG. 2B), operated by a module controller (not shown), device controllers 310A-310E, a rack controller (not shown), or the like. Inlet duct 302 provides airflow from the HVAC to devices 303A-303E, possibly regulated by each device's damper 307A-307E. and exhaust duct 304 combines the module output flow 304A from devices 303A-303E and releases the combined module outlet flow from the module through port 305. Inlet duct 302 may receive module intake flow 302A from rack inlet duct 204 of FIG. 2A, or from internal cavity 212A of FIG. 2B. Exhaust duct 304 may send airflow, via port 305, to rack exhaust duct 214 of FIG. 2B, or to internal cavity 202A of FIG. 2A.

Figure 4A:
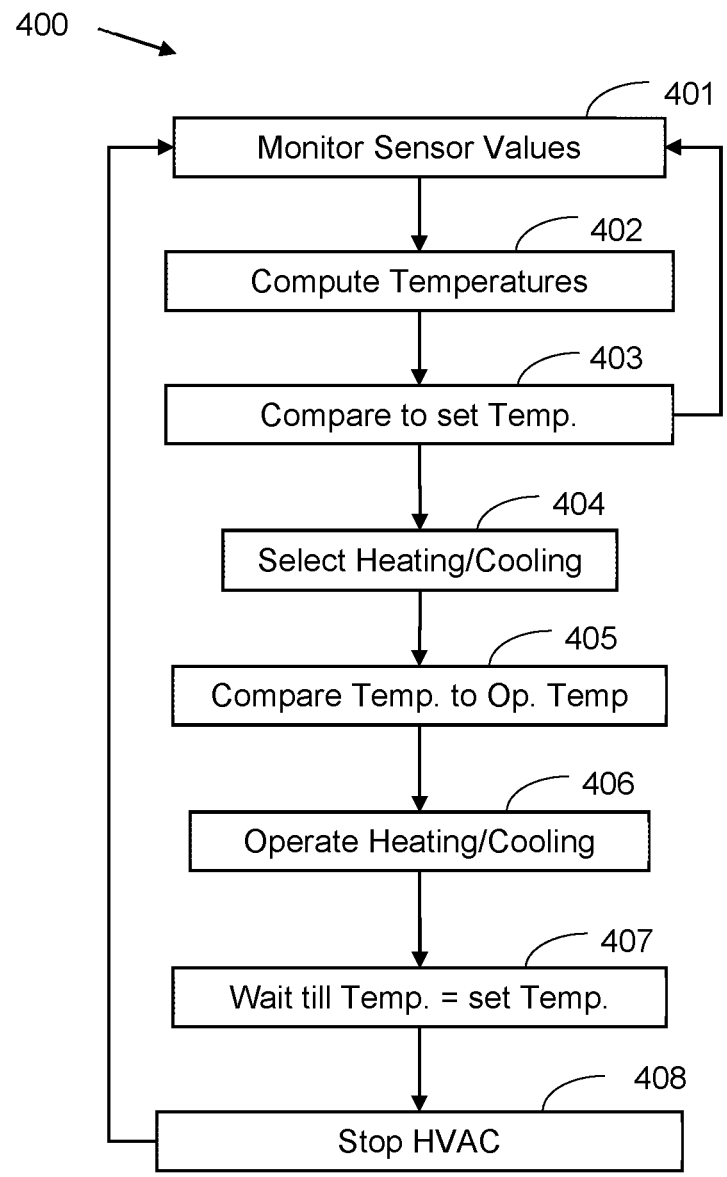
FIG. 4A shows a flowchart of a method for controlling a containerized HVAC system that includes a duct system, dampers, and sensors.

Reference is now made to FIG. 4A, which shows a flowchart 400 of a method for controlling a containerized HVAC system that includes a duct system, dampers, and sensors. Sensor values may be monitored as at step 401, such as by a controller. Controller may compute temperatures as at step 402, such as for a component, device, module, rack, or the like. Controller may compare temperatures for a component, device, module, rack, or the like to the setpoint temperatures as at step 403. Controller may select an HVAC state, such as heating, cooling, or ventilation, as at step 404. Controller may compare actual temperatures of racks, modules or devices, to operating temperatures as at step 405, where an operating temperature is the setpoint temperature with plus or minus (depending on HVAC state) a hysteresis value used to allow hysteresis of the HVAC operation and control loop. The controller may have a temperature set point with hysteresis, so that turn-on and turn-off may occur at different temperatures. For example, the system may have a "setpoint temperature", which may be the desired operating temperature. For a particular set point, the system may turn on at a first temperature threshold, and turn off at a second threshold. The first threshold may be, for example when cooling, the setpoint temperature plus the hysteresis value, and the second threshold may be the setpoint temperature. Alternatively, the first threshold may be when cooling the setpoint temperature, and the second threshold may be the setpoint temperature minus the hysteresis value. Alternatively (or additionally), rather than receiving a setpoint temperature value and a hysteresis value, the system may receive two thresholds—a first threshold to turn on the HVAC, and the second threshold to turn off the HVAC. The thresholds may be different for cooling state, heating state, or ventilation state.

In some cases, the HVAC (when determined to operate in cooling state) does not need to immediately start the cooling operation when the actual temperature of rack, module or device just goes above the set point from a lower temperature, but waits until the actual measured temperature (e.g., measured temperature) of rack, module or device further goes above a first threshold temperature (e.g., the setpoint temperature plus the hysteresis value) to start the cooling operation. The HVAC may not turn off the cooling operation until the actual temperature of rack, module or device again falls below the set point.

As another example, the HVAC (when determined to operate in heating state) does not need to immediately start the heating operation when the actual temperature of rack, module or device just falls below to the setpoint from a higher temperature, but waits until the actual temperature of rack, module or device further falls below a first threshold temperature (e.g., the setpoint temperature minus the hysteresis value) to start the heating operation.

Alternative configuration of a hysteresis effect may be implemented where the HVAC operation begins at the setpoint temperature, and does not stop until a temperature difference of the hysteresis value is achieved between the actual measured temperature of the rack, module, or device, and the setpoint temperature.

Any other implementations of hysteresis of the HVAC operation may be used in the present disclosure so long as they do not deviate from principles of hysteresis used in engineering control systems.

The results of the comparison at step 405 may determine the operation of the HVAC unit as at step 406. The controller may continue monitoring sensors and computing temperatures, to wait till the temperature is equal to the setpoint temperature as at step 407. Once the temperatures are equal, the controller may command the HVAC to stop operation at step 408, and return to monitoring the sensor values, computing temperatures, and comparing to setpoint temperatures as at steps 401, 402, and 403. Once the monitored temperatures deviate from the setpoint temperatures, such as absolutely or deviate by a hysteresis value, the method may repeat. For example, at steps 401 and 402, the controller may determine (e.g., compute) an average temperature of the container based on the sensor values. When the average temperature of the container deviates from the setpoint, the comparison of step 403 may determine the selecting of step 404. For example, when the temperature of a battery cell deviates by the hysteresis value, the controller, may compare as at step 405 and operate as at step 406. The comparison at step 403 is a container-wide comparison to determine if the HVAC needs to be in heating, cooling, or ventilation. The comparison at step 405 is a local comparison of the devices, modules and racks within the containers to determine the on/off state of the HVAC (as in apply cooling or apply heating) and the damper positions when needed. The hysteresis value used in step 403 and the hysteresis value used in step 405 may be same as or different from each other.

For example, a setpoint temperature of 25° C. is set for the battery cell temperatures, and an actual temperature measurement of the battery cells A through F are: 27, 29, 40, 32, 28, and 31° C., respectively. Controller in this example will compare setpoint and actual temperatures initially as at step 403 to determine that the HVAC needs to operate in cooling mode as at step 404. For example, the controller may determine that the average temperature of the temperature measurements of 27, 29, 40, 32, 28, and 31° C. is 31.2° C., and determine that the average temperature (31.2° C.) exceeds the set point (25° C.) by 6.2° C. that is more than the hysteresis value (e.g., 4° C.). Based on this determination, the controller may determine that HVAC needs to operate in cooling mode at step 404. A second comparison of the temperatures as at step 405 may determine that the actual temperatures of cells A, B and E exceed the set point by less than the hysteresis value of 4° C. and thus cells A, B and E may require ventilation; and the actual temperatures of the other cells (e.g., cells C, D and F) exceed the set point by more than the hysteresis value of 4° C. and thus cells C, D and F may require cooling. For example, the cells C, D and F may have actual temperatures of 40, 32, and 31° C. respectively, and these cells may be monitored by a controller. As long as the actual temperatures of the cells A-F are all above the set point, the HVAC unit may receive commands to keep in operation with fan at full speed until the cells A-F are at most at the setpoint temperature of 25° C. In this example, as the actual temperatures of one or more of the cells A-F are above the operating temperature (the setpoint temperature plus the hysteresis value), such as 25° C. plus 3° C. or total of 28° C., the HVAC unit may receive a command to start actively cooling again and may turn the fan on. In some examples, the HVAC does not turn off the cooling operation until the actual temperatures of the cells A-F fall below 25° C. Alternatively, the hysteresis value may be set as a different value, e.g., 2° C., and the HVAC does not turn off the cooling operation until the actual temperatures of the cells A-F fall below 25° C. minus 2° C. or total of 23° C. In some other examples, the system may receive a first threshold to turn on the cooling operation, and a second threshold to turn off the cooling operation. The first threshold and the second threshold may be symmetric or asymmetric with respect to the setpoint temperature. For example, the first threshold may be 27° C. (2° C. above the setpoint temperature of 25° C.), and the second threshold may be 23° C. (2° C. below the setpoint temperature of 25° C.). As another example, the first threshold may be 26° C. (1° C. above the setpoint temperature of 25° C.), and the second threshold may be 23° C. (2° C. below the setpoint temperature of 25° C.). As the actual temperatures of one or more of the cells A-F are above the first threshold, the HVAC unit may receive a command to start actively cooling again and may turn the fan on. The HVAC does not turn off the cooling operation until the actual temperatures of the cells A-F fall below the second threshold. The HVAC is then set, by the controller, to operate as at step 406. When dampers within the module are used, the controller may fully open damper to cell C, open to 25% the dampers to cells D and F, and open only 5% the dampers to cells A, B and E. This allows full cooling to reach cell C, some cooling to reach cells D and F, and minimum cooling to reach cells A, B, and E.

The comparison and setting of steps 403 and 404 determine when the HVAC needs to be set to a cooling, heating, or ventilation state, and the comparison and operating of steps 405 and 406 determine the damper positions and to continue the current state of operation of the HVAC. This allows using an average temperature of the container to determine the operation state of the HVAC at step 404, but individual rack, module or cell temperatures to be used for determining the damper positions at step 406.

In FIG. 4A, the order of the steps may vary, one or more of the steps may be omitted, and steps may be combined and/or otherwise modified. For example, step 405 may be performed prior to step 404, and the comparison results at step 405 may also be used to determine the operation state of the HVAC at step 404. As another example, step 407 may be a decision step which determines if the temperature is equal to the set point. In this example, when the temperature is equal to the set point, the process may proceed to step 408; when not, the process may loop and wait or go back to step 401.

Figure 4B:
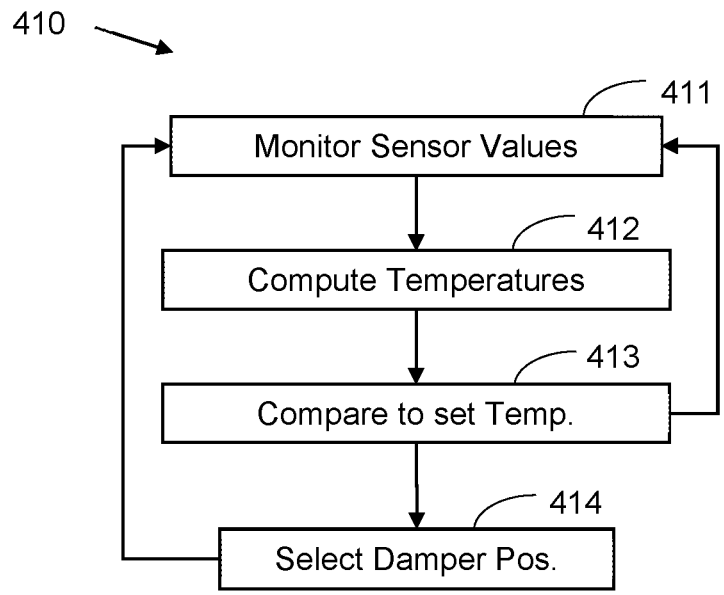
FIG. 4B shows a flowchart of a method for controlling damper positions in a containerized HVAC system that includes a duct system, dampers, and sensors.

Reference is now made to FIG. 4B, which shows a flowchart 410 of a method for controlling damper positions in a containerized HVAC system that includes a duct system, dampers, and sensors. Sensor values may be monitored as at step 411, such as by a controller. Controller may compute temperatures as at step 412, such as for a component, device, module, rack, or the like. Controller may compare temperatures to setpoint temperatures as at step 413, and based on the comparison, the controller may adjust a position of a damper, as at step 414, such as a damper on a duct leading to a device, a module, a rack, or the like. For example, as shown in the example of FIG. 3, a controller may monitor temperatures from devices in the module, such as battery cells each including a temperature sensor. In this example, when the average cell temperature deviates from the setpoint temperature by a hysteresis value, the controller may determine a position of a damper that determines the amount of HVAC output air flowing into the module. For example, a controller may monitor temperatures from modules in a rack, such as datacenter modules. In this example, when the average temperature of the battery cells or modules in the rack deviates from the setpoint temperature, the controller may determine a position of a damper that determines the amount of HVAC output air flowing into the rack. For example, if the average temperature of battery cells in a device is higher than the setpoint temperature by the hysteresis value, the damper connected to the device may be incrementally opened to increase cooling airflow from HVAC; and if the average temperature of battery cells in a device is lower than the setpoint temperature, the damper connected to the device may be incrementally closed to decrease cooling airflow from HVAC. The hysteresis value may be used in some cases and not in others, such as when the continuous operation may not require starts/stops (no hysteresis effect may be needed).

Figure 4C:
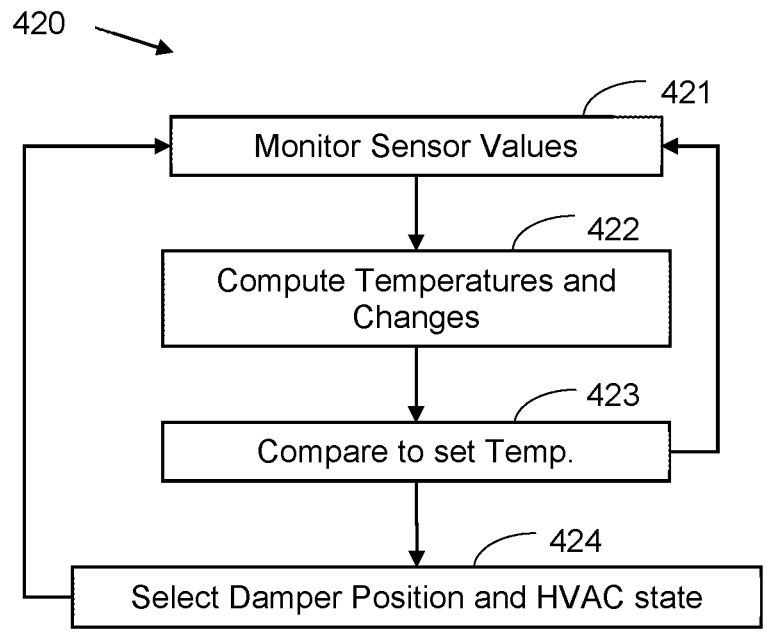
FIG. 4C shows a flowchart of a method for controlling damper position and HVAC system settings in a containerized HVAC system that includes a duct system, dampers, and sensors.

Reference is now made to FIG. 4C, which shows a flowchart of a method 420 for controlling damper position and HVAC system settings in a containerized HVAC system that includes a duct system, dampers, and sensors. Sensor values may be monitored as at step 421, such as by a controller. Controller may compute temperatures as at step 422, such as for a component, device, module, rack, or the like. Controller may compare the computed temperatures to setpoint temperatures as at step 423, and based on the comparison, the controller may adjust a position of a damper and an HVAC operation, as at step 424. For example, a controller may monitor temperatures from devices in the module, such as battery cells each including a temperature sensor. In this example, when the average cell temperature deviates from the setpoint temperature, the controller may determine a position of a damper that determines the amount of HVAC output air flowing into the module, and send commands to the HVAC unit to determine the HVAC operational state (heating, cooling, or ventilation) and/or initiate operation of the HVAC unit.

In the description of various illustrative features, reference is made to the accompanying drawings, which form a part hereof, and in which is shown, by way of illustration, various features in which aspects of the disclosure may be practiced. It is to be understood that other features may be utilized and structural and functional modifications may be made, without departing from the scope of the present disclosure.

The term "multiple" as used here in the detailed description indicates the property of having or involving several parts, elements, or members. The claim term "a plurality of" as used herein in the claims section finds support in the description with use of the term "multiple" and/or other plural forms. Other plural forms may include for example regular nouns that form their plurals by adding either the letter 's' or 'es' so that the plural of converter is converters or the plural of switch is switches for example.

It may be noted that various connections may be set forth between elements herein. These connections may be described in general and, unless specified otherwise, may be direct or indirect; this specification may be not intended to be limiting in this respect. Further, elements of one feature may be combined with elements from other features in appropriate combinations or sub-combinations.

All optional and preferred features and modifications of the described features and dependent claims may be usable in all aspects of the invention taught herein. Furthermore, the individual features of the dependent claims, as well as all optional and preferred features and modifications of the described features may be combinable and interchangeable with one another.

The skilled person will appreciate that inventive aspects disclosed herein may include an apparatus or a system or a method as in any of the following clauses:

Clauses:

Clause 1. A system comprising:
an HVAC unit; and
at least one duct from the HVAC unit to an equipment rack.

Clause 2. The system of Clause 1, wherein the at least one duct extends from an output of the HVAC unit to an intake of the equipment rack.

Clause 3. The system of any one of Clauses 1 or 2, wherein the at least one duct extends from an intake of the HVAC unit to an output of the equipment rack.

Clause 4. The system of any one of Clauses 1 to 3, wherein the at least one duct comprises a first duct extending from an intake of the HVAC unit to an output of the equipment rack and a second duct extending from an output of the HVAC unit to an intake of the equipment rack.

Clause 5. The system of any one of Clauses 1 to 4, further comprising at least one damper configured for regulating an airflow through the at least one duct.

Clause 6. The system of any one of Clauses 1, further comprising:
- at least one temperature sensor located within the equipment rack;
- a controller, configured to:
- monitor temperature data from the at least one temperature sensor;
- compute a temperature value based on the temperature data;
- compare the temperature value to a temperature setpoint value; and
- control an operation of the HVAC unit based on the comparison, wherein the control comprises:
- setting the HVAC unit to a heating mode when the temperature value is substantially less than the temperature setpoint value,
- setting the HVAC unit to a cooling mode when the temperature value is substantially greater than the temperature setpoint value, or
- setting the HVAC unit to a ventilation mode when the temperature value is substantially equal to the temperature setpoint value.

Clause 7. The system of Clause 6, wherein the temperature sensor is incorporated in a module of the equipment rack.

Clause 8. The system of any one of Clause 6 or 7, wherein the temperature sensor is incorporated in a device of the equipment rack.

Clause 9. The system of any one of Clauses 6 to 8, wherein the temperature sensor is incorporated in a component of the equipment rack.

Clause 10. The system of any one of Clauses 6 to 9, further comprising at least one damper configured for regulating an airflow through the at least one duct, and wherein the controller is further configured to control a position of the damper based on the difference between the temperature value and the temperature setpoint value.

Clause 11. The system of any one of Clauses 6 to 10, wherein the controller is further configured for controlling an operation of modules in the equipment rack based on the comparison.

Clause 12. A method comprising:
- monitoring at least one temperature sensor located in an equipment rack, wherein the equipment rack is located inside a shipping container;
- computing a temperature value associated with the equipment rack;
- comparing the temperature value to a temperature setpoint value; and
- controlling an HVAC unit, located at least in part external to the shipping container, based on the comparing, wherein the controlling comprises:
- setting the HVAC unit to a heating mode when the temperature value is substantially less than the temperature setpoint value,
- setting the HVAC unit to a cooling mode when the temperature value is substantially greater than the temperature setpoint value, or
- setting the HVAC unit to a ventilation mode when the temperature value is substantially equal to the temperature setpoint value;
- wherein at least one duct is located between the HVAC unit and the equipment rack.

Clause 13. The method of Clause 12, wherein the at least one duct extends from an output of the HVAC unit to an intake of the equipment rack.

Clause 14. The method of any one of Clause 12 or 13, wherein the at least one duct extends from an intake of the HVAC unit to an output of the equipment rack.

Clause 15. The method of any one of Clauses 12 to 14, wherein the at least one duct comprises a first duct extending from an intake of the HVAC unit to an output of the equipment rack and a second duct extending from an output of the HVAC unit to an intake of the equipment rack.

Clause 16. The method of any one of Clauses 12 to 15, wherein the temperature sensor is incorporated in a module of the equipment rack.

Clause 17. The method of any one of Clauses 12 to 16, wherein the temperature sensor is incorporated in a device of the equipment rack.

Clause 18. The method of any one of Clauses 12 to 17, wherein the temperature sensor is incorporated in a component of the equipment rack.

Clause 19. The method of any one of Clauses 12 to 18, further comprising regulating an airflow through the at least one duct by controlling at least one damper.

Clause 20. The method of any one of Clauses 12 to 19, further comprising regulating an airflow through the at least one duct by controlling a position of at least one damper based on the difference between the temperature value and the temperature setpoint value.

Clause 21. The method of any one of Clauses 12 to 20, further comprising based on the comparing, controlling the operation of modules in the equipment rack.

Clause 22. A battery electrical storage system (BESS) comprising:
- a container;
- an HVAC unit;
- an equipment rack;
- at least one duct from the HVAC unit to the equipment rack.

Clause 23. The BESS of Clause 22, wherein the at least one duct extends from an output of the HVAC unit to an intake of the equipment rack.

Clause 24. The BESS of any one of Clause 22 or 23, wherein the at least one duct extends from an intake of the HVAC unit to an output of the equipment rack.

Clause 25. The BESS of any one of Clauses 22 to 24, wherein the at least one duct comprises a first duct extending from an intake of the HVAC unit to an output of the equipment rack and a second duct extending from an output of the HVAC unit to an intake of the equipment rack.

Clause 26. The BESS of any one of Clauses 22 to 24, further comprising at least one damper configured for regulating an airflow through the at least one duct.

Clause 27. The BESS of any one of Clauses 22 to 24, further comprising:
- at least one temperature sensor located within the equipment rack;
- a controller, configured to:
- monitor temperature data from the at least one temperature sensor;
- compute a temperature value based on the temperature data;

compare the temperature value to a temperature setpoint value; and control an operation of the HVAC unit based on the comparison, wherein the control comprises:
setting the HVAC unit to a heating mode when the temperature value is substantially less than the temperature setpoint value,
setting the HVAC unit to a cooling mode when the temperature value is substantially greater than the temperature setpoint value, or
setting the HVAC unit to a ventilation mode when the temperature value is substantially equal to the temperature setpoint value.

Clause 28. The BESS of Clause 26, wherein the temperature sensor is incorporated in a module of the equipment rack.

Clause 29. The BESS of any one of Clauses 26 to 28, wherein the temperature sensor is incorporated in a device of the equipment rack.

Clause 30. The BESS of any one of Clauses 26 to 29, wherein the temperature sensor is incorporated in a component of the equipment rack.

Clause 31. The BESS of any one of Clauses 26 to 30, further comprising at least one damper configured for regulating an airflow through the at least one duct, and wherein the controller is further configured to control a position of the damper based on the difference between the temperature value and the temperature setpoint value.

Clause 32. The BESS of any one of Clauses 26 to 31, wherein the controller is further configured for controlling an operation of modules in the equipment rack based on the comparison.

What is claimed is:

1. A system comprising:
a shipping container comprising:
a plurality of equipment racks, each comprising a plurality of electrical energy storage modules and a rack damper, and wherein each of the plurality of electrical energy storage modules comprises one of a plurality of temperature sensors and one of a plurality of module dampers;
a heating, ventilation, and air-conditioning (HVAC) unit;
a first duct extending continuously from an intake of the HVAC unit to an output of an equipment rack of the plurality of equipment racks thereby preventing a mixing of exhaust from the equipment rack with fresh air entering the equipment rack; and
a controller, configured to:
monitor temperature values from the plurality of temperature sensors; and
control an operation of the plurality of electrical energy storage modules, wherein the control comprises:
increasing a charge current or a discharge current of one of the plurality of electrical energy storage modules when the respective temperature value is less than a temperature setpoint value, or
decreasing a charge current or a discharge current of one of the plurality of electrical energy storage modules when the respective temperature value is greater than the temperature setpoint value,
wherein the first duct comprises a first end abutting the output and a second end abutting the intake, and wherein the first duct comprises a single section or element, wherein the rack damper and plurality of module dampers are controlled based on temperature measurements from respective sensors of the plurality of temperature sensors.

2. The system of claim 1, further comprising a second duct extending continuously from an output of the HVAC unit to an intake of each of the plurality of equipment racks, and wherein the second duct comprises a single section or element.

3. The system of claim 2, wherein the second duct comprises a third end abutting the output of the HVAC unit and a fourth end abutting the intake of each of the plurality of equipment racks.

4. The system of claim 1, further comprising at least one damper configured for regulating an airflow through the first duct.

5. The system of claim 1, further comprising:
at least one rack temperature sensor located within each equipment rack;
a controller, configured to:
monitor temperature values from the at least one rack temperature sensor; and
control an operation of the HVAC unit, wherein the control comprises:
setting the HVAC unit to a heating mode when a temperature value of the temperature values is less than a temperature setpoint value,
setting the HVAC unit to a cooling mode when the temperature value is greater than the temperature setpoint value, or
setting the HVAC unit to a ventilation mode when the temperature value is equal to the temperature setpoint value.

6. The system of claim 5, wherein each at least one rack temperature sensor is incorporated in a module of each equipment rack.

7. The system of claim 5, wherein each at least one rack temperature sensor is incorporated in a device of each equipment rack.

8. The system of claim 5, wherein each at least one rack temperature sensor is incorporated in a component of each equipment rack.

9. The system of claim 5, wherein the rack damper is configured for regulating an airflow through the first duct, and wherein the controller is further configured to control a position of the rack damper based on the difference between the temperature value of each of the plurality of equipment racks and the temperature setpoint value.

10. The system of claim 6, wherein the controller is further configured for controlling an operation of the plurality of module dampers in each of the plurality of equipment racks based on comparing the temperature values of each of the plurality of electrical energy storage modules to the temperature setpoint value.

11. A method comprising:
monitoring a plurality of temperature values using a plurality of temperature sensors located in each of a plurality of electrical energy storage modules, each of the plurality of electrical energy storage modules located in one of a plurality of equipment racks, wherein the plurality of equipment racks is located inside a shipping container;
controlling an HVAC unit integrated with the shipping container;
controlling a plurality of module dampers, one each in each of the plurality of electrical energy storage modules, and a rack damper, one each in each of the plurality of equipment racks, based on the plurality of temperature values; and controlling an operation of the plurality of electrical energy storage modules, wherein the control comprises:
increasing a charge current or a discharge current of one of the plurality of electrical energy storage modules when the respective temperature value is less than a temperature setpoint value, or
decreasing a charge current or a discharge current of one of the plurality of electrical energy storage modules when the respective temperature value is greater than the temperature setpoint value,
wherein a first duct extends continuously from an intake of the HVAC unit to an output of each equipment rack of the plurality of equipment racks thereby preventing a mixing of exhaust from the equipment rack with fresh air entering the plurality of equipment racks, wherein the first duct comprises a first end abutting the output and a second end abutting the intake, and wherein the first duct comprises a single section or element.

12. The method of claim 11, further comprising a second duct extending continuously from an output of the HVAC unit to an intake of each of the plurality of equipment racks, and wherein the second duct comprises a single section or element.

13. The method of claim 12, wherein second duct comprises a third end abutting the output of the HVAC unit and a fourth end abutting the intake of each of the plurality of equipment racks.

14. The method of claim 11, wherein a rack temperature sensor is incorporated in a module of each equipment rack.

15. The method of claim 11, wherein a rack temperature sensor is incorporated in a device of each equipment rack.

16. The method of claim 11, wherein a rack temperature sensor is incorporated in a component of each equipment rack.

17. The method of claim 11, further comprising regulating an airflow through the first duct by controlling the rack damper or at least one of the plurality of module dampers.

18. The method of claim 11, further comprising regulating an airflow through the first duct by controlling a position of the of rack damper or at least one of the plurality of module dampers based on the difference between the plurality of temperature values and a temperature setpoint value.

* * * * *